(12) United States Patent
Bonvalot et al.

(10) Patent No.: US 7,282,104 B2
(45) Date of Patent: Oct. 16, 2007

(54) METHOD OF FIXING A SEALING OBJECT TO A BASE OBJECT

(75) Inventors: Beatrice Bonvalot, Bures sur Yvette (FR); Sylvie Barbe, Puiselet le Marai (FR); Laurent Le Moullec, Paris (FR); Robert Leydier, Orsay (FR)

(73) Assignee: Axalto SA, Meudon (FR)

( * ) Notice: Subject to any disclaimer, the term of this patent is extended or adjusted under 35 U.S.C. 154(b) by 414 days.

(21) Appl. No.: 10/494,877

(22) PCT Filed: Nov. 6, 2002

(86) PCT No.: PCT/IB02/04652

§ 371 (c)(1),
(2), (4) Date: Nov. 16, 2004

(87) PCT Pub. No.: WO03/041153

PCT Pub. Date: May 15, 2003

(65) Prior Publication Data

US 2005/0061431 A1 Mar. 24, 2005

(30) Foreign Application Priority Data

Nov. 7, 2001 (FR) .................................. 01 14577

(51) Int. Cl.
*B32B 37/00* (2006.01)
*H01L 21/30* (2006.01)

(52) U.S. Cl. ........................ 156/87; 156/286; 257/618; 257/622; 257/E21.499; 438/455

(58) Field of Classification Search .................. 156/87, 156/286; 438/455; 257/E21.499, 618, 622
See application file for complete search history.

(56) References Cited

U.S. PATENT DOCUMENTS 5,683,947 A * 11/1997 Baumann ..................... 438/129

FOREIGN PATENT DOCUMENTS

JP          62-149428 A  *  7/1987

\* cited by examiner

*Primary Examiner*—Jeff H Aftergut
(74) *Attorney, Agent, or Firm*—The Jansson Firm; Pehr Jansson

(57) ABSTRACT

A sealing-object (4) is fixed to a base-object (10). The sealing-object comprises a through-hole (5). The objects are fixed to each other in the following manner. In a preparation step, a fixing layer (1, 2, 3) is provided between the base-object and the sealing-object. In addition an evacuation device (6) equipped with an evacuation channel (7) is placed onto the sealing-object. The through-hole of the sealing object has a first extremity opening out on the evacuation channel and a second extremity opening out on the fixing layer. In a fixing step, the fixing layer is heated which causes the fixing layer to release gas. The gas is at least partially evacuated via the through-hole of the sealing-object and the evacuation channel of the evacuation device.

8 Claims, 2 Drawing Sheets

METHOD OF FIXING A SEALING OBJECT TO A BASE OBJECT

BACKGROUND OF THE INVENTION

The invention concerns a method of fixing a sealing-object to a base-object. The sealing-object and the base-object can be, for example, silicon wafers. This type of method physically protects an electrical circuit included in one of the silicon wafers. This type of protection is an advantage, for example, in the field of smartcards. 2. Description of the Related Art The French patent application number 2 767 966 concerns a secured integrated circuit device. The device includes an active layer with a semiconducting material and circuits integrated with the semiconducting material. This active layer includes an active side on which there are contact studs. An additional layer is then Axed to this active layer via an intermediate fixing layer, for example a thermosetting plastic. This fixing layer is deposited in the viscous state. Apart from its bonding properties, it is resistant to the traditional solvents.

Generally, its properties of bonding and resistance to solvents are temperature activated. During this activation, redundant products are formed in the intermediate fixing layer. Some redundant products are products resulting from various intermediate chemical reactions occurring, in particular, as a result of this activation. Other redundant products are solvents, especially solvents required to ensure that activation occurs correctly.

SUMMARY OF THE INVENTION

One objective of the invention is to allow the fixing of a sealing-object to a base-object with an enhanced quality.

According to one aspect of this invention, a method of fixing a sealing-object to a base-object, wherein the sealing-object comprises a through-hole, the method comprising:
- a preparation step, in which a fixing layer is provided between the base-object and the sealing-object, and in which an evacuation device equipped with an evacuation channel is placed onto the sealing-object, the through-hole of the sealing object having a first extremity opening out on the evacuation channel and a second extremity opening out on the fixing layer;
- a fixing step, in which the fixing layer is heated which causes the fixing layer to release gas, the gas being at least partially evacuated via the through-hole of the sealing-object and the evacuation channel of the evacuation device.

The invention takes the following aspects into consideration. The presence of gas in the fixing layer weakens the fixing. The invention causes the fixing layer to release gas during the fixing step. Consequently, the fixing of the sealing-object to the base-object is more resistant: it will be more difficult to separate the sealing-object from the base-object. The invention thus allows the fixing of a sealing-object to a base-object with an enhanced quality. This is important, for example, when fixing one silicon wafer comprising electrical circuits to another silicon wafer. This leads to better physical protection of an electrical circuit included in one of the silicon wafers. Smartcards are therefore more secure.

BRIEF DESCRIPTION OF THE DRAWINGS

It will be easier to understand the invention on reading the non limiting description below, written with reference to the accompanying drawings, where.

DERSCRIPTION OF THE INVENTION

The invention may be applied to fix a first silicon wafer to a second silicon wafer.

Figure 1:
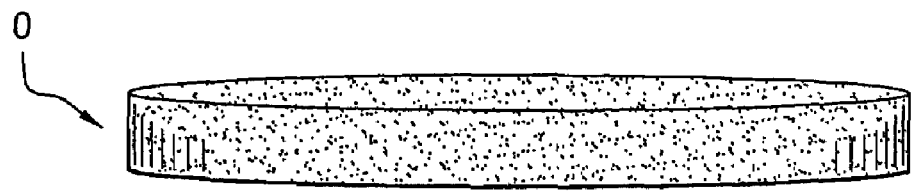
FIG. 1 illustrates a silicon wafer.
Figure 2:
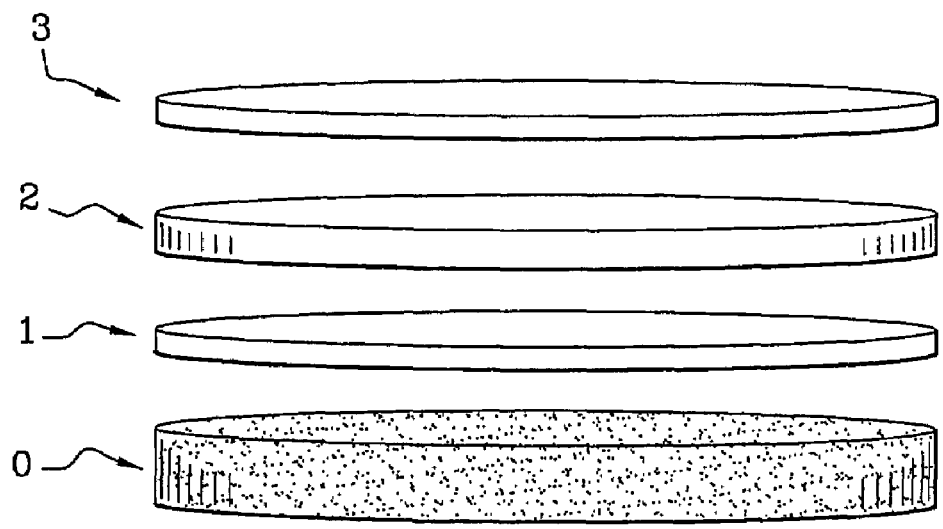
FIG. 2 illustrates a deposition step.

FIG. 1 illustrates the first silicon wafer 0. This wafer includes active elements, for example electrical circuits, and contact studs. FIG. 2 illustrates a deposition step. In this step, a layer of adhesive 2 and, optionally, auxiliary layers 1 and 3 are deposited on the first silicon wafer 0. The auxiliary layers 1 and 3 include one or more adhesion and impermeability agents.

The adhesive layer 2 is preferably obtained from a polyimide dispensed as an acid or ether polyamic in solution. The thickness of the adhesive layer 2 is preferably between 2 µm and 30 µm.

The auxiliary layers 1 and 3 are preferably organosilanes. They are deposited in liquid or viscous state in a solvated form, for example by centrifuging. The auxiliary layers 1 and 3 are for example, several dozen nanometres thick. The auxiliary layers 1 and 3 are preferably heated then cooled to improve the adhesion and impermeability properties.

The assembly consisting of the first wafer 0 and the layers 1, 2 and 3 deposited above is, preferably, heated. Consequently, the solvents contained in layers 1, 2 and 3 evaporate. Another advantage of this heating is that it fastens together the first wafer 0 and the layers 1, 2 and 3, making it easier to handle the assembly. The heating also helps to adapt to the roughness due to the presence of the active elements on the first silicon wafer 0.

Figure 3:
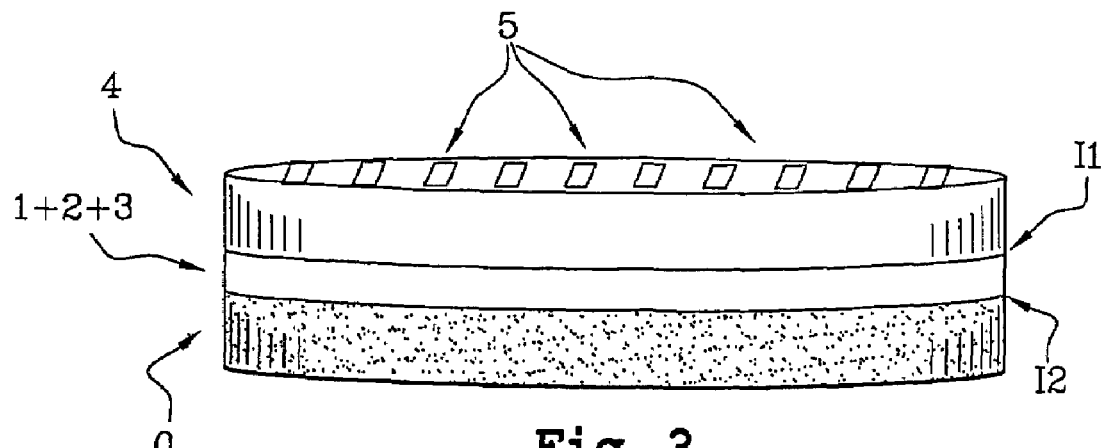
FIG. 3 illustrates a positioning step.

FIG. 3 illustrates a positioning step in which a second silicon wafer 4 is put in contact with the assembly illustrated on FIG. 2. The second silicon wafer 4 is pierced with through-holes 5. The positioning is carried out so that one or more through-holes 5 are opposite the contact studs of the first silicon wafer 0. Layers 1, 2 and 3 can also be pierced with through-holes opposite the contact studs, for example by engraving or exposure. The first silicon wafer can therefore be connected electrically to an external element using a wire. One or more electrical connections can also be made between the two silicon wafers 0 and 4.

The assembly formed by the first silicon wafer 0, the layers 1, 2 and 3 and the second silicon wafer 4 will be referred to hereafter as the wafer assembly.

Figure 4:
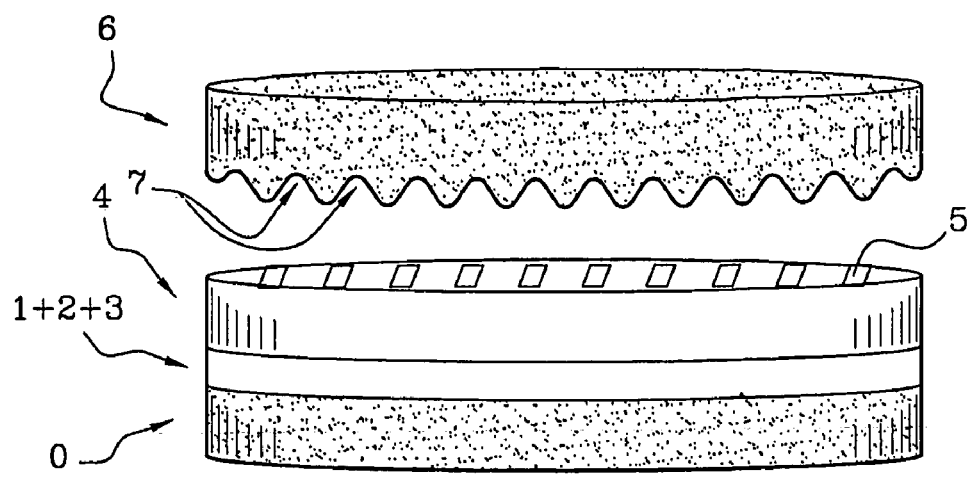
FIG. 4 illustrates a sealing step.

FIG. 4 illustrates a sealing step, in which the wafer assembly undergoes the following treatment. An evacuation plate 6 is placed on the second silicon wafer 4. This evacuation plate is equipped with channels 7, preferably opening out on the sides of the evacuation plate 6. These open channels 7 are used to evacuate the redundant products contained in the layers 1, 2 and 3. This evacuation occurs by degassing via the through-holes 5 of the second silicon wafer 4.

In the sealing step, the wafer assembly is heated to evacuate the redundant products by degassing and allow chemical reactions in layers 1, 2 and 3 to take place. In particular, the temperature must be greater than the boiling points of the solvents present in layers 1, 2 and 3 to enable their degassing. If the temperature is too high, however, the bonding properties of layers 1, 2, and 3 deteriorate. For example, if the layer of adhesive 2 consists of polyimide, a temperature comprised between 200° C. and 400° C. is suitable; it can be in particular 270° C. Advantageously, during this sealing step the ramp-up of the temperature is controlled so that the degassing does not happen with a too high degassing flux.

Pressure is applied uniformly over the wafer assembly, for example using a press. For example, a pressure of 3 bars, applied for a period of 4 hours, is suitable.

Note that the auxiliary layers 1 and 3 improve the adhesion of the layer of adhesive 2 on the silicon wafers 0 and 4. In addition, the auxiliary layers 1 and 3 increase the impermeability of the bonding of the silicon wafers 0 and 4. The bond will therefore be less sensitive to chemical attack, for example.

Figure 5:
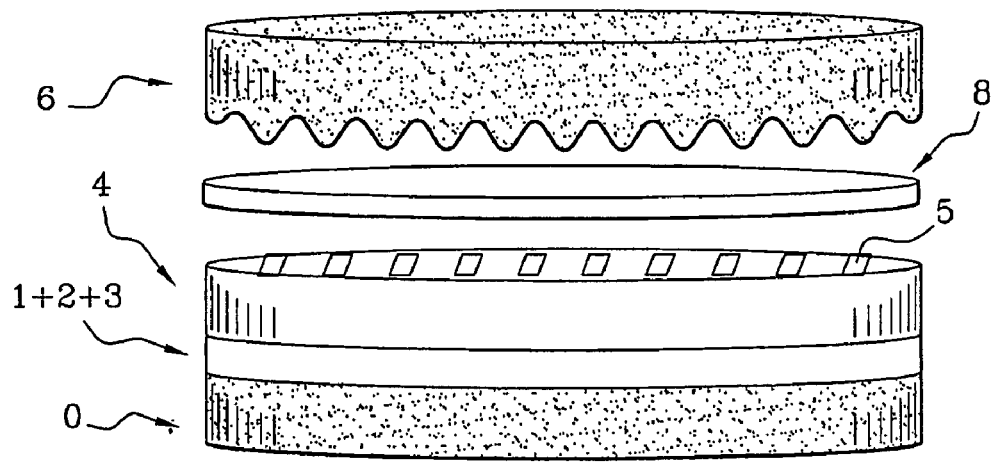
FIG. 5 illustrates an advantageous variant of the sealing step.

FIG. 5 illustrates the following aspect. A flexible membrane 8 with porosity and creep properties can be inserted between the second silicon wafer 4 pierced with through-holes 5 and the evacuation plate 6 equipped with evacuation channels 7. The flexible membrane 8 is made of a porous material so that the redundant products can be evacuated via the evacuation channels 7 in the evacuation plate 6 during degassing. The porous material can be, for example, a fibrous membrane made of expanded polytetrafluorethylene (PTFE). The water entry pressure of a membrane can be used to define the porosity of the material. We can used, for example, a flexible membrane made of expanded PTFE whose water entry pressure is, for example, greater than 0,05 bar/60 sec and, preferably greater than 0,6 bar/60 sec. Such a flexible membrane 8 may be distributed by the GORE company (registered trademark). Advantageously, in the case of a silicon wafer having a total thickness variation (ITV) comprised between 0,1 µm and 25 µm, a flexible membrane having a thickness which is, for example, at least equal to the total thickness variation and which is preferably comprised between 50 µm and 2 mm, can be used. The flexible membrane 8 thus ensures that the various pressure forces exerted during the sealing step are applied uniformly. This reduces the effects of any geometric faults in the silicon wafers and possibly the effects of rough areas mainly due to the presence of active elements. Advantageously, the flexible membrane 8 is made of a material, which does not substantially chemically react with the second silicon wafer 4, the evacuation plate 6 and the redundant products. For example, the expanded PTFE is also a material that can be advantageously used to this purpose.

After the sealing step, redundant products still remains in the fixing layer 2. To ensure that the bond is relatively resistant, it is best to evacuate these remaining redundant products.

Figure 6:
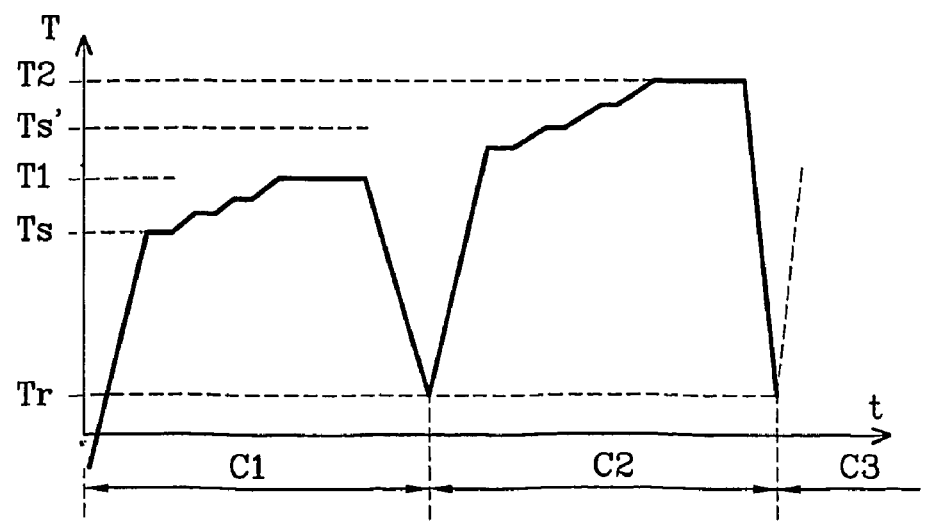
FIG. 6 illustrates an evacuation step.

FIG. 6 illustrates an evacuation step. This step is used to evacuate the remaining redundant products. In addition, it allows chemical reactions to take place in the layer of adhesive 2, which also help to improve the bonding strength.

More precisely, FIG. 6 illustrates the heating and cooling cycles C1 and C2 of the wafer assembly. The horizontal axis represents time, the vertical axis the temperature to which the wafer assembly is exposed. In cycle C1, the temperature increases rapidly up to a sealing temperature Ts. Then the rate of temperature rise slows down considerably. This rise is interrupted by stages of constant temperature, preferably every 10° C., until it reaches a long degassing phase at constant temperature T1. The temperature then drops down to a temperature Tr, well below the sealing temperature Ts. Cycle C2 is similar to cycle C1. In cycle C2, the degassing phase takes place at a temperature T2 which is greater than T1 in cycle C1.

This succession of cycles causes a type of thermal pumping effect. Almost all the redundant products in the layer of adhesive 2 can therefore be evacuated. This ensures that the bonding of the wafers is relatively resistant.

Preferably, the sealing step and the evacuation step are carried out with several wafer assemblies. The assemblies are simply stacked on top of each other and subjected simultaneously to the sealing step and the evacuation step. To simplify this stacking, the wafer assemblies can be individually pre-sealed in a step introduced before the sealing step. This pre-sealing step can be carried out, for example, by thermo-compression at a relatively low temperature. A pressure of 3 bars at a temperature of 60° C. for 15 minutes gives satisfactory results.

Moreover, it is advantageous to clean the contact studs just after the pre-sealing, preferably by ionic bombardment.

When various wafer assemblies are stacked, the effects of the geometric faults and the surface roughness are multiplied. The use of a flexible membrane 8 illustrated on FIG. 6 will therefore be particularly advantageous.

The method described previously illustrates the following characteristics. A sealing-object is fixed to a base-object. The sealing-object comprises a through-hole. The objects are fixed to each other in the following manner. In a preparation step, a fixing layer is provided between the base-object and the sealing-object. In addition an evacuation device equipped with an evacuation channel is placed onto the sealing-object. The through-hole of the sealing object has a first extremity opening out on the evacuation channel and a second extremity opening out on the fixing layer. In a fixing step, the fixing layer is heated which causes the fixing layer to release gas. The gas is at least partially evacuated via the through-hole of the sealing-object and the evacuation channel of the evacuation device.

The above-mentioned description concerns also an assembly comprising a first silicon slice and a second silicon slice fixed to each other, each silicon slice having an inner main face and an outer main face, the first silicon slice and the second silicon slice being fixed by means of a fixing layer provided between the inner main faces of the silicon slices, the second silicon slice comprising a through-hole having a first extremity opening out on the inner main face and a second extremity opening out on the outer main face.

The above-mentioned description concerns also an assembly comprising a first silicon slice and a second silicon slice fixed to each other by means of a fixing layer, the fixing layer comprising two main faces and a peripheral face, one main face being fixed to the first silicon slice and the other main face being fixed to the second silicon slice, the fixing layer comprising evacuation channels opening out on the peripheral face.

Obviously, the description of the mode of realisation described above does not limit the invention, which must be understood in the broad sense.

In the above-mentioned description, a flexible fibrous membrane 8 made of expanded PIFE has been used. Other fibrous material can also be used, for example, some fibrous composite material, in particular, a fibrous composite material like silicon carbon or a fibrous composite material comprising glass and PTFE. More generally one can use any porous flexible membrane, which is porous enough, so that redundant elements can be evacuated from the fixing layer.

Advantageously the mechanical rigidity of the porous flexible membrane is substantially less than that of the sealing object and than that of the evacuation device, thus enabling to compensate for variations in thickness of the base object, of the sealing object and of the evacuation device.

Advantageously, the porous flexible membrane is chemically inert so that the porous flexible membrane does not substantially chemically react with the sealing object, the evacuation and the redundant products; and, also so that the porous flexible membrane can resist to the temperature applied during the process.

The adhesive layer 2 in the mode of realisation described previously is a polyimide. Generally, this method is suitable for any fixing layer that can be heated so that gas is released from the fixing layer. This could be for example thermosetting plastics with creep properties and which are temperature stable above the temperature of decomposition of the active elements present in particular on the first silicon wafer.

The mode of realisation described previously concerns the fixing of two silicon wafers comprising or not integrated circuits. The principles described previously can be used to fix objects other than silicon wafers. It is, for example, possible to replace a silicon wafer by a wafer, a slice or a substrate made of a material other than silicon. More generally, the invention concerns the fixing of a base-object to a sealing-object.

In the mode of realisation described previously, the evacuation plate is equipped with open channels. More generally the invention applies to any evacuation device, which is arranged to allow at least partially the evacuating of gas contained in the fixing layer in the fixing step. For example, it is possible to use an evacuation device whose geometry is different from that of a plate. It is also possible to have channels opening out directly on a sealing-object, thereby avoiding the need for the evacuation plate as such. Note that the total thickness variation (TTV) of a layer is the difference between the biggest thickness of the layer and the smallest thickness of the layer. The TTV may be, for example, due to geometrical defaults of the layer or to the presence of specific elements.

Although specific embodiments of the invention have been described and illustrated, the invention is not to be limited to the specific forms or arrangements of parts so descried and illustrated. The invention is limited only by the claims.

The invention claimed is:

1. An assembly comprising a first silicon slice and a second silicon slice fixed to each other, each silicon slice having an inner main face and an outer main face, the first silicon slice and the second silicon slice being fixed by means of a fixing layer produced through heating and having redundant products released during the heating and provided between the inner main faces of the silicon slices, the second silicon slice comprising a through-hole having a first extremity opening out on the inner main face and a second extremity opening out on the outer main face wherein said through-hole is designed to enable the evacuation of the redundant products.

2. A method of fixing a sealing-object to a base-object, wherein the sealing-object comprises a through-hole, the method comprising:
   a preparation step, in which a fixing layer is provided between the base-object and the sealing-object, and in which an evacuation device equipped with an evacuation channel is placed onto the sealing-object, the through-hole of the sealing object having a first extremity opening out on the evacuation channel and a second extremity opening out on the fixing layer;
   a fixing step, in which the fixing layer is heated which causes the fixing layer to release gas, the gas being at least partially evacuated via the through-hole of the sealing-object and the evacuation channel of the evacuation device.

3. The method according to claim 2, wherein the base-object is a substrate comprising integrated circuits.

4. The method according to claim 1, wherein the sealing-object is a substrate of the same type as the base-object.

5. The method according to claim 2, wherein in the fixing step, the fixing layer is heated by varying the temperature according to cycles so as to obtain a thermal pumping effect.

6. The method according to claim 2, wherein in the preparation step, an auxiliary layer is provided between the base-object and the fixing layer, the auxiliary layer comprising an adhesion agent and an impermeability agent.

7. The method according to claim 2, wherein in the preparation step, an auxiliary layer is provided between the sealing-object and the fixing layer, the auxiliary layer comprising an adhesion agent and an impermeability agent.

8. A method of sealing a base object, the method comprising:
   a preparation step, in which an assembly is formed that comprises, in successive order, the base object, a fixing layer, a sealing object and a gas-evacuation object, the sealing object being provided with a through-hole and the gas-evacuation object being provided with a gas-evacuation channel, the assembly being formed so that the through hole constitutes a passage extending from the fixing layer to the gas-evacuation channel;
   a fixing step, in which the assembly is heated which causes the fixing layer to release a gas, the gas being at least partially evacuated via the through hole of the sealing object and the gas-evacuation channel of the gas-evacuation object.

* * * * *